United States Patent [19]

Goto et al.

[11] Patent Number: 5,712,855
[45] Date of Patent: Jan. 27, 1998

[54] APPARATUS FOR TESTING AND MEASURING ELECTRONIC DEVICE AND METHOD OF CALIBRATING ITS TIMING AND VOLTAGE LEVEL

[75] Inventors: Masaharu Goto, Hannou; Kenichi Ito, Hachioji, both of Japan

[73] Assignee: Hewlett-Packard Company, Palo Alto, Calif.

[21] Appl. No.: 145,419

[22] Filed: Oct. 29, 1993

[30] Foreign Application Priority Data

Oct. 30, 1992 [JP] Japan .................... 4-316572

[51] Int. Cl.$^6$ ................ G06K 5/04; G11B 27/00
[52] U.S. Cl. ................ 371/1; 371/61; 395/555
[58] Field of Search ............... 371/1, 25.1, 27, 371/5.1, 5.4, 60, 61, 62; 364/571.01, 579; 395/555, 556, 558

[56] References Cited

U.S. PATENT DOCUMENTS

| | | | |
|---|---|---|---|
| 4,497,056 | 1/1985 | Sugamori | 371/25.1 |
| 4,928,278 | 5/1990 | Otsuji et al. | 371/1 |
| 5,153,883 | 10/1992 | Hayashi et al. | 371/27 |
| 5,212,443 | 5/1993 | West et al. | 324/158 R |

FOREIGN PATENT DOCUMENTS 1-84167  3/1989  Japan .

OTHER PUBLICATIONS

Hewlett Packard, HP9490 Mixed Signal LSI Test System, 1991.

Primary Examiner—Robert W. Beausoliel, Jr.
Assistant Examiner—Trinh L. Tu

[57] ABSTRACT

The present invention is intended to provide a testing and measuring apparatus for accurately and quickly calibrating the input and output timing of a plurality of test signal patterns and voltage levels. The invention also offers a method used for the calibration. The apparatus is equipped with a plurality of units (timing vector generators) each having a timing-generating circuit (a capture timing generator) and an external common reference timing circuit (a golden edge generator) outside the units. Each unit comprises: (1) a timing comparator circuit (a capture comparator) for comparing the timing each of the timing-generating circuits with the timing of the reference timing circuit to determine whether the former timing leads or lags the latter timing; and (2) a counter circuit which counts a number of comparisons made by the comparator circuit until their sequential relation has been reversed.

8 Claims, 2 Drawing Sheets

APPARATUS FOR TESTING AND MEASURING ELECTRONIC DEVICE AND METHOD OF CALIBRATING ITS TIMING AND VOLTAGE LEVEL

FIELD OF THE INVENTION

The present invention relates to an apparatus (e.g., an IC tester) for measurement of signals for testing and measuring an electronic device and to a method of calibrating its timing and voltage level. In particular, the invention relates to the above-described circuit that is capable of accurately and quickly calibrating input and output timing of plural test signal patterns and voltage levels.

BACKGROUND OF THE INVENTION

For example, a testing apparatus such as an IC tester for a digital circuit generates various waveforms at any user-determined timing and detects the voltage level of the waveforms. High accuracy in timing is needed. However, the necessary accuracy varies among an operating speed of a device to be tested. For high-speed devices, accuracy may be often higher than hundreds of picoseconds. To achieve such strict timing accuracy, it is essential to calibrate the timing of the testing apparatus.

In recent years, IC devices tend to have a large number of input/output pins, for example 256 pins. With this trend, IC testers which examine these devices also tend to have a larger number of pins. With an increasing number of pins, units of a per-pin structure such as in timing vector generators and pin-electronics are increased. Thus, it is inevitable that the number of pieces of hardware which needs calibration for timing and voltage levels is also increased.

A conventional method involves serially calibrating timing of pins with respect to a reference pin or to an external reference. In this method, timing is calibrated for each pin. The results of each measurement are stored in a storage device such as a capture memory. Upon the completion of the measurements of all the pins, a main CPU analyzes the contents of the capture memory to obtain data for the calibration. However, since measurements for the calibration of each pin must be performed successively, an exorbitant amount of time is needed for this method. An amount of measured data is also exorbitant. Thus, the transfer and calculation time by the CPU is undesirably long.

Another conventional method which alleviates these problems is disclosed in Japanese Patent Laid-Open No. 41875/1989. A control CPU is provided for each per-pin resource, and calibration is processed in parallel. This method shortens the time required for the measurements of timing in the above-described serial calibration method. However, since a control CPU must be provided for each per-pin resource, this increases the cost of the whole measuring apparatus.

SUMMARY OF THE INVENTION

The present invention has been proposed to solve the above discussed problems. It is an object of the invention to provide a testing and measuring apparatus which accurately and quickly calibrates the input and output timing of a plurality of test signal patterns and voltage levels. It is another object of the invention to improve a method of calibrating the timing and the voltage levels.

An apparatus for testing and measuring an electronic device in accordance with the present invention is provided with a plurality of units each having a timing-generating circuit. The apparatus has an external common reference timing circuit, a common reference timing circuit inside one of the units, or different timing circuits. The apparatus is characterized in that each of the units comprises: a timing comparator circuit which compares the timing of each timing-generating circuit with the timing of the reference timing circuit to determine whether the former timing leads the latter timing; and a counter circuit which counts the number of comparisons made by the comparator circuit until the time relation between the two circuits changes.

A method of calibrating timing in accordance with the present invention comprises the steps of: varying timing of each timing generating circuit or of the reference timing circuit in a stepwise fashion in such a way that the timing of each timing-generating circuit outpaces, or is outpaced by the timing of the reference timing circuit; counting the number of variations in the phase until the lead of the timing of each timing-generating circuit relative to the timing of the reference-timing circuit changes into a lag or vice versa; and determining the relation between the timing of the reference timing circuit and the timing of each timing generating circuit to calibrate the timing of each timing generating circuit.

An apparatus for testing and measuring an electronic device according to the invention further comprises a plurality of units each having a voltage-generating circuit. The apparatus has an external common reference voltage level circuit, a common reference voltage circuit inside one of the units, or independent reference voltage level circuits on the units. Each of the units further comprises: a comparator circuit which compares the voltage level of the voltage-generating circuit with the voltage level of the reference voltage level circuit to determine whether the former voltage level is higher or lower than the latter voltage level; and a counter circuit which counts the number of comparisons made by the comparator circuit and stops the counting when the two voltage levels are reversed in magnitude.

A method of calibrating voltage levels in accordance with the present invention further comprises the steps of: varying the voltage level of each voltage-generating circuit or of the reference voltage level circuit in a stepwise fashion so that the voltage level of each voltage-generating circuit becomes higher or lower than the voltage level of the reference voltage level circuit; counting the number of different voltage levels until the relation between the voltage level of each voltage-generating circuit and the voltage level of the reference voltage level circuit is reversed in their magnitude; and determining the relation between the voltage level of the reference voltage level circuit and the voltage level of each voltage-generating circuit to calibrate the voltage level of each voltage-generating circuit.

The apparatus for testing and measuring an electronic device is not limited to such devices IC testers. For example, the invention embraces an apparatus for testing and measuring IC verifiers or the like which need calibration of timing between plural units and calibration of voltage levels. One example in applying the current invention is timing vector generators of per-pin structure and per-pin boards of pin-electronics in the field of IC testers.

DETAILED DESCRIPTION OF THE PREFERRED EMBODIMENTS

Figure 1:
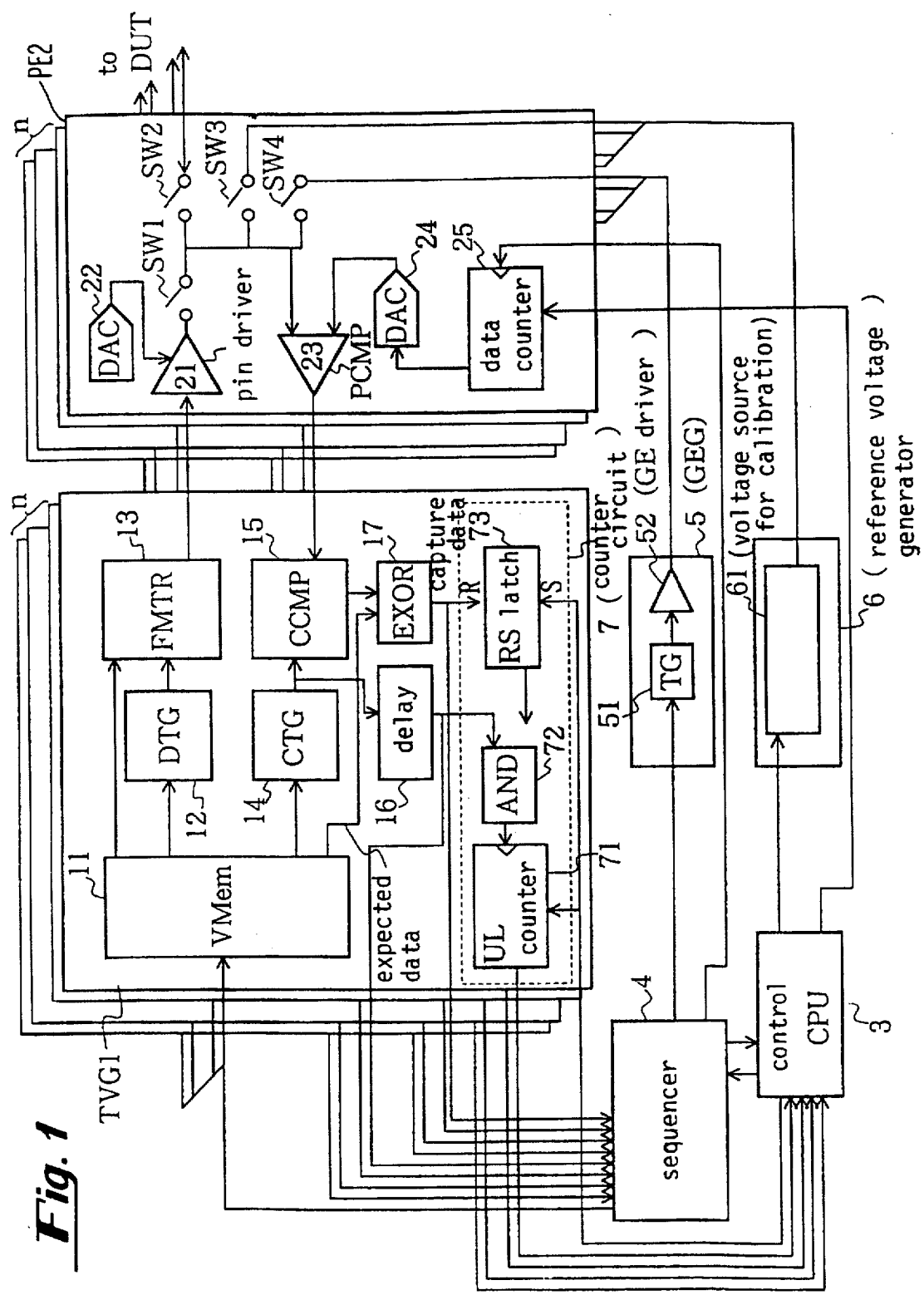
FIG. 1 is a fragmentary circuit diagram of an apparatus according to the invention.

FIG. 1 is a fragmentary diagram which schematically shows an IC tester for illustrating an embodiment of the invention. The fundamental structure and operation of the illustrated IC tester will be briefly described. In FIG. 1, n pin-electronics PE2's of a per-pin structure correspond to n timing vector generators TVG1 of the per-pin structure. The timing vector generators TVG1 furnish test signals to a DUT (not shown) or receive response signals from the DUT via the pin-electronics. The n TVG1's and PE2's form a unit according to the invention.

A control CPU 3 controls the operation of the whole IC tester including stopping and starting of a sequencer 4. The sequencer 4 controls the TVG1's etc. on a real-time basis. The sequencer 4 can supply addresses to a vector memory (VMem) 11 and performs operations including a conditional jump and a stopping test depending on whether the output signal from an EXOR gate 17 indicates a matched condition or an unmatched condition. Information such as a pattern, a timing, a format (drive data), and other data to be generated by the TVG1 is stored in the VMem 11 in the TVG1. When a test signal is supplied to the DUT, a driving timing generator (DTG) 12 generates a timing edge signal at a particular resolution (preferably 20 to 100 psec) according to the information stored in the VMem 11 and delivers the timing edge signal to a formatter (FMTR) 13.

The FMTR 13 creates a driving waveform according to the timing edge from the DTG 12 and information on the pattern and format from the VMem 11. A pin driver 21 installed in the PE2 drives this driving waveform up to the voltage level desired by the user and delivers it to the DUT via switches SW1 and SW2. A D/A converter (DAC) 22 applies a voltage to the pin driver 21 for setting a desirable pin drive level. Usually, a preferred range of this voltage is approximately from +10 to −4 V. A sufficient resolution is about 14 bits (0.855 mV).

When the response signal from the DUT is received by TVG1, the pin output voltage from the DUT is applied to one input terminal of a pin comparator (PCMP) 23 via the SW1. A reference voltage is supplied to the other input terminal of the PCMP 23 from a DAC 24 for setting the pin comparator level. Usually, a preferred range of this voltage is from +10 to −4 V and a preferred resolution is about 14 bits as in the DAC 22. The comparator level of the DAC 24 is supplied from a data counter 25. The counter 25 is incremented by an input signal from the sequencer 4 and reset by an input reset signal from the control CPU 3.

An output signal (hereinafter referred to as the "capture data") from the PCMP 23 is fed into a capturing comparator (CCMP) 15. The capture data is then fed to the EXOR gate 17 in response to a timing signal generated by a capturing timing generator (CTG) 14. The timing generated by the CTG 14 is determined based upon the timing information from the VMem 11. A preferred resolution of this timing is about 20 to 100 psec as in the resolution of the timing of the DTG 12 as described above.

The EXOR gate 17 determines whether the expected data from the VMem 11 agrees with the capture data from the CCMP 15. The results are given to the sequencer 4. The sequencer 4 receives a timing signal from the CTG 14 via a delay circuit 16 that acts to generate a strobe signal. In this way, the results of the decision by the EXOR gate 17 is received by the sequencer 4 at an appropriate timing.

FIG. 1 also shows a reference timing circuit such as a golden edge generator (GEG) 5, operated under the control of the sequencer 4 and a reference voltage level circuit such as a reference voltage generator 6 operated under the control of the control CPU 3. The GEG 5 further comprises a timing generator (TG) 51 for generating a timing signal for the golden edge generator 51 and a golden edge driver (GE driver) 52. The reference voltage generator 6 comprises at least a voltage source 61 producing a reference voltage used for calibration.

The output signals from the GEG 5 and from the reference voltage generator 6 are delivered to a counter circuit 7 via SW3 or SW4, the pin comparator 23 installed in the PE2, the comparator 15, and the EXOR gate 17. Each TVG1 is equipped with the counter circuit 7. The counter circuit 7 comprises an unmatched logging counter or UL counter 71, an AND gate 72, and a RS latch 73. The RS latch 73 is set when the signal from the control CPU 3 is applied to its S terminal. The RS latch 73 is reset when the output signal from the EXOR gate 17, which indicates whether the capture data is the same as the expected data, is applied to its R terminal. The AND gate 72 receives the outputs from the RS latch 73 and the output from the delay circuit 16 and send a signal to the counter circuit 7. The UL counter 71 also receives a signal from the control CPU 3 at its S terminal in such a way that the counter 71 is reset simultaneously with the RS latch 73. The value of the UL counter 71 is read by the control CPU 3.

Embodiments of the calibration method according to the invention are described hereinafter.

(1) Method of Calibrating Timing of CTG 14

Since the timing of the timing-generating circuits successively varies, timing of the timing generator circuit CTG 14, for example, gets ahead of that of the reference timing circuit GEG 5. In this case, it is assumed that the SW1, SW2 and SW3 as shown in FIG. 1 are opened and that only SW4 is closed. If the resolution of the CTG 14 is 20 psec and the worst timing error prior to calibration is +10 nsec, the error corresponds to about 2 m of the electrical conductor in length on the printed-wiring board which has a dielectric constant of 5 based upon a sufficiently large estimated error value. It is also assumed that the data length of the UL counter 71 is 10 bits.

Timing data and expected data about the CTG 14 are successively written at addresses ranging from N to N+1023 in the VMem 11. The timing data are regularly shifted by $T/2^{10}$ at intervals of T. It is assumed that all the expected data are zeros. In this example, the expected signal is low level. Thus, exactly the same data items consisting of the same timing data item and the same expected data item are written to the VMem 11 of each TVG 1. Therefore, all the arrays of the pins can be written in parallel.

Assuming that the data length of address is 16 bits, only 16×1024/8=2 k bytes of data need to be written. However, according to the present invention, a counter is used instead of the VMem 11, and this transfer is unnecessary. This further shortens the required time for calibration. The GEG 51 is set in such a way that if the timing error is 0, the timing is expected to agree with the timing stored at the data address N+512 for each pin. The GE driver 52 delivers a rectangular wave which varies from a low level (or 0) to a high level (or 1) based on this timing.

In the present method of calibration, the UL counter 71 is reset. At the same time, the RS latch 73 is reset. Upon the completion of resetting, the sequencer 4 starts from address N. The GE driver 52 produces a timing edge (golden edge) at every address. Every edge is captured by the TVG1. The EXOR 17 which acts as a timing comparator circuit decides whether they are matched.

Figure 2:
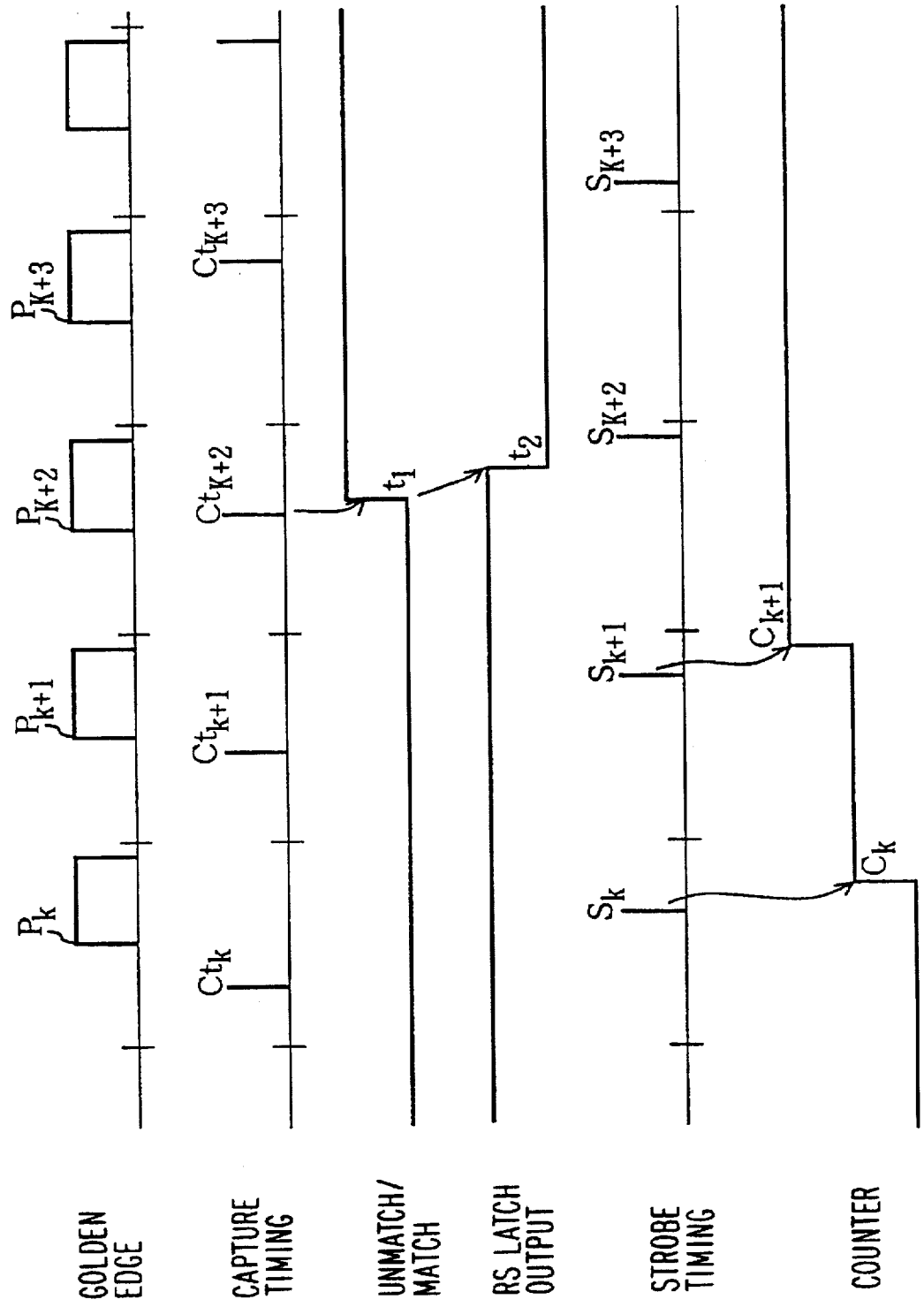
FIG. 2 is a timing diagram illustrating the case in which the timing of the circuit of FIG. 1 is calibrated, using an external common reference timing circuit.

As shown in FIG. 2, at early addresses of the VMem 11, the capture timing as indicated by $Ct_k$ and $Ct_{k+1}$ precedes the golden edge at $P_k$, $P_{k+1}$ i.e., the timing at which a transition is made from low level to high level. The CCMP 15 captures low level (or 0 level). Since the expected data is set to 0, a matched condition is obtained. Therefore, the EXOR 17 does not reset the RS latch 73. Accordingly, whenever the delay circuit 16 produces a strobe signal such as $s_k$ and $s_{k+1}$, the UL counter 71 counts as indicated by signals such as $c_k$, $c_{k+1}$.

As the address of the VMem 11 progresses, the timing of the CTG 14 lags the timing of the golden edge. Finally, the CCMP 15 captures high level (or 1 level). Also in this case, the expected data is set to 0. As indicated by the capture timing $Ct_{k+2}$ of FIG. 2, the expected data has an unmatched relation to the capture data. The RS latch 73 is reset at $t_1$ and $t_2$. When the RS latch 73 is reset and the output becomes 0, the strobe signals such as $s_{k+2}$ and $s_{k+3}$ do not arrive at the UL counter 71. At this time, counter data $B_n$ which is the value of the UL counter 71 of the n-th TVG1 is stored in the UL counter 71. When the expected data has an unmatched relation to the capture data for every TVG1, the operation of the sequencer 4 is stopped.

The value of the UL counter 71 of the TVG1 is read by the control CPU 3. $B_n$ read by the control CPU 3 shows that the timing data written to N+Bn−1 agrees with the timing of the golden edge with an accuracy of $T/2^{10}$ at the n-th TVG1, where T is the interval. If the same results are stored using the VMem 11 and they are transferred to the desired processor, it is necessary to transfer data of 1024 bits per pin, or 1024 bits×256/8=32 k bytes for a 256 pin system. On the other hand, in the present example, the read data is only 10 bytes at most per TVG1. Even for a system comprising 256 pins, the total amount of transfer is only 320 bytes (=10×256 bits). The timing can be measured with a high accuracy for such a small amount of data transfer.

In the above measurement, it is assumed that the timing value of the golden edge signal approximately agrees with the timing value written at the address N+512. If necessary, the above-described step is repeated for the address N+X (X≠512) to determine the offset, the gain error, and the linearity of each CTG 14. In this way, the timing of each CTG 14 is calibrated accurately.

(2) Method of Calibrating Timing of DTG 12

By this method, timing of the timing-generating circuits is successively varied on a regular basis in such a way that the timing of each reference timing circuit such as the CTG 14 which has been calibrated precedes the timing of each timing-generating circuit such as the DTG 12. Accordingly, the timing of the timing-generating circuit will be calibrated.

In FIG. 1, the SW2, SW3, and SW4 are open, and only the SW1 is closed to accomplish the calibration of DTG 12. As described above, the CTG 14 has been calibrated as the "independent reference timing circuit" in the present embodiment. It is assumed that the resolution of the DTG 12 is 20 psec, and that the worst timing error prior to calibration is +10 nsec. The data written at addresses N to N+1023 of the VMem 11 are the same as ones used for the method of calibrating timing of CTG 14. Thus, the timing output from the CTG 14 is also the same as that used for the method of calibrating CTG 14. Such timing is preset in the DTG 12 of each TVG1. If the DTG 12 has no error, the timing value agrees with the timing value written at the address N+512 of the VMem 11. The FMTR 13 sends a rectangular wave to the CCMP 15 via the pin driver 21, the SW1, and the PCMP 23. The wave changes from a low level to a high level at the above-described address. Also, the UL counter 71 is reset and, at the same time, the RS latch 73 is set. The sequencer 4 is started upon the onset of the value comparison from address N. The FMTR 13 produces one timing edge which is to be calibrated at each address. The CCMP 15 captures every timing edge and determines if a matched relation is obtained.

At early addresses of the VMem 11, since the timing (capture timing) of the CTG 14 precedes that of the FMTR 13, the CCMP 15 captures a low level. The UL counter 71 increments whenever the delay circuit 16 produces a strobe signal. Since the operation of the counter circuit 7 is previously described, it is briefly described. If the timing of the CTG 14 lags the timing of the FMTR 13, the CCMP 15 captures a high level. The RS latch 73 is reset. The counter data $C_n$ (the value of the UL counter 71 of the n-th TVG1) obtained at this time is stored in the UL counter 71. When the expected data has an unmatched relation to the capture data for every TVG1, the operation of the sequencer 4 is stopped. The control CPU 3 reads the value of the UL counter 71 of the TVG1. The $C_n$ value shows that the timing of the FMTR 13 matches the timing of the CTG 14 written at N+$C_n$−1 at the n-th TVG1. Thus, an accurate measurement of timing is performed with a quite small amount of transfer.

If the need arises, the step described above is repeated at the address N+X (X 512). Thus, the offset, the gain error, and the linearity of each DTG 12 are determined. In this way, the timing of each DTG 12 can be calibrated accurately.

(3) Method of Calibrating Voltage Level of PCMP 23

In this method, the voltage level of the above-described voltage-generating circuit such as DAC 24 is varied in a stepwise fashion so that the PCMP 23 is calibrated according to the voltage level of the reference voltage level circuit such as a reference voltage generator 6. Since the method is implemented substantially the same way as those of the methods (1) and (2), the voltage calibration method will be briefly described.

First, SW1, SW2, and SW4 are open, and only the SW3 is closed. The UL counter 71 has been previously reset. The RS latch 73 is set. After the control CPU 3 resets the counter 25, the sequencer 4 increments the data counter 25, and the voltage level of the DAC 24 is varied in a stepwise fashion. The PCMP 23 which operates as a voltage comparator circuit compares the voltage level of the DAC 24 with the voltage from a calibrated voltage source 61 of the reference voltage generator 6. Initially, the voltage level of the DAC 24 is lower than the voltage level of the calibrated voltage source 61. Thus, the PCMP 23 delivers a low level. If the voltage level of the DAC 24 is in excess of a given reference voltage, the PCMP 23 produces a high level.

The output from the PCMP 23 is delivered to the CCMP 15 and then to the EXOR 17 at the timing of the CTG 14. It is to be noted that the timing of the CTG 14 is not required to be as accurate as in the calibration methods of (1) and (2) of timing described above. The EXOR 17 compares 0 output from the VMem 11 with the capture data from the CCMP 15. If the capture data is 0, 0 is sent to the RS latch 73. By the same token, if the capture data is 1, 1 is sent to the RS latch 73. Therefore, if the capture data is 0, the output from the AND gate 72 is 0. The UL counter 71 is not incremented. The counter data Dn is preserved.

When the expected data has an unmatched relation to the capture data for every TVG, the operation of the sequencer 4 is stopped. The control CPU 3 reads the value of the UL counter 71 for the nth TVG1. Consequently, the threshold voltage for the DAC 24 can be determined at an accuracy equal to the resolution of the counter. The voltage level of the DAC 24 is thus calibrated.

A measurement can be made in the same way as the foregoing by modifying the voltage level of the reference voltage generator 6. In this way, the linearity and other factors of the DAC 24 are measured.

(4) Method of Calibrating Voltage Level of Pin Driver 21

The voltage level of the above-described reference voltage level circuit such as DAC 22 is varied in a stepwise fashion so that the pin driver 21 is calibrated. The PCMP 23 has been previously calibrated.

In this case, in FIG. 1, the SW2, SW3, and SW4 are open, and only the SW1 is closed. The voltage level of the pin driver 21 is calibrated based on the voltage level of the DAC 24, which varies in a stepwise fashion. The phase of the CTG 14 is also varied in a stepwise fashion instead of the VMem 11. The counter is incremented according to the trigger from the sequencer 4. The timing edge is made to shift in a stepwise fashion with a phase difference.

The operation of the present invention is summarized for (A) the calibration of timing-generating circuits and (B) the calibration of voltage-generating circuits.

(A) Calibration of Timing-Generating Circuits

In a test apparatus such as an IC tester, a timing vector generator is equipped with a timing generating circuit. Usually, a common reference timing circuit exists outside the unit. In general, the timing of the timing generating circuits is calibrated based upon the reference timing circuit.

In a test apparatus, each unit is often equipped with two or more timing-generating circuits. According to one method of the current invention, the timing-generating circuit which has been already calibrated is taken as an independent reference timing circuit. Other timing-generating circuits may be calibrated based upon the independent reference timing circuit.

In accordance with the present invention, timing of timing-generating circuits among units is calibrated in the manner described below. For convenience of illustration, it is assumed that a common reference timing circuit is located outside the units. First, a timing comparator circuit incorporated in each unit determines whether a timing-generating circuit to be calibrated leads or lags timing of a reference timing circuit. To determine whether the former timing leads or lags the latter timing, the reference timing circuit delivers a periodic H/L signal (rectangular wave) at intervals of T. Meanwhile, the timing-generating circuits deliver triggers whose phases successively vary. For example, the phase of each trigger increases successively within a range from T to 2T. In a preferred embodiment, the phase increases an increment of T/210. The phase decreases also successively within a range from T to 0 in steps of T/210. At this time, the first trigger may be set so that the first trigger is produced when the periodic H/L signal is at low level or high level. The timing of the timing-generating circuit outpaces or sometimes is outpaced by the timing of the reference timing circuit by increasing or reducing the phase. Thus, the timing comparator circuit of each unit determines whether a timing relation between the reference and timing-generating circuit of a corresponding unit has been reversed (i.e. a leading and lagging circuits are reversed).

A counter circuit counts the number of the agreements or disagreements detected by the timing comparator circuit. The counting is continued until a leading circuit changes to a lagging circuit or vice versa. The change does not always simultaneously occur for every unit. Therefore, the timing error among the timing generating circuits can be determined based upon a total count for a given accuracy. This accuracy depends on the phase described above. If the phase of each timing-generating circuit changes completely linearly, and if the phase changes in an increment of $T/2^{10}$, the accuracy is also $T/2^{10}$.

The measurement described above is carried out several times by varying the timing of the periodic H/L signal from the reference timing circuit relative to the first trigger from the timing-generating circuit so as to accurately determine the relation. Specifically, the offset, the linearity, the gain error, etc. of each timing circuit as well as the timing error among the timing-generating circuits are accurately determined. This permits accurate calibration of the timing generating circuits.

(B) Calibrating of Voltage-Generating Circuits

A test apparatus such as an IC tester normally has an external common reference voltage circuit outside a unit such as pin-electronics. The voltage level of a voltage-generating circuit in the unit is calibrated based on a voltage level of a reference voltage circuit.

As mentioned above, the reference voltage circuit is usually located outside a unit but it may be located in the same unit. In this embodiment, the voltage-generating circuit is used as a "reference voltage level circuit." In a test apparatus, each unit is often equipped with two or more voltage-generating circuits. In this case, the calibrated voltage-generating circuit may be used as an independent reference voltage level circuit. The timing of the other voltage-generating circuits in the same unit may be calibrated based upon the independent reference voltage level circuit.

In the present example, the voltage level among the units is calibrated in the manner described below. For convenience of illustration, it is assumed that a common voltage-generating circuit is present outside the units.

First, the voltage level comparator circuits in different units simultaneously determine whether a voltage level of a voltage-generating circuit to be calibrated is higher than that of the above-described reference voltage level circuit. The reference voltage level circuit delivers a voltage signal for a given level. On the other hand, the voltage-generating circuit delivers a stepwise voltage signal within a rang from 0 to V or vice versa, for example, in steps of V/210. Thus, the voltage level of the voltage-generating circuit becomes higher or lower than that of the reference voltage level circuit.

The counter circuit counts the number of comparisons made by the voltage level comparator circuit. The counting is continued until the magnitude relation is reversed. The counter circuit used herein may be the same as one used for the timing calibration method. The magnitude relation is not always reversed simultaneously among the units. Therefore, the error in the voltage level between the voltage-generating circuit is determined based upon the count value for a given accuracy. This accuracy depends on the resolution of the steps by which the voltage is varied. If the voltage of the voltage-generating circuit is varied completely linearly, and if the voltage varies in steps of V/210, the accuracy is also V/210.

The measurements described above may be taken several times while varying the reference voltage level. This enables an accurate determination of the relation between the reference voltage level circuit and the voltage level of each voltage-generating circuit. That is, the offset, the linearity, etc. of each voltage-generating circuit as well as the error between the voltage-generating circuits are accurately determined. Hence, the voltage-generating circuit is calibrated with a high accuracy.

In the present invention, a counter circuit for calibration further comprises a counter of about 10 bits and a simple gate device. Since the counter is based on parallel calibration measurements, the calibration method according to the current invention is enhanced. At the same time, the cost of the apparatus is reduced.

When a calibration is made using a capture memory, as much as 32 k bytes of measurement data are required to be transferred or calculated per measurement point for a system having 256 pins. On the other hand, in the present invention, calibration measurement data are on the order of 2 k bytes at most per measurement point for a system having 256 pins. The time required to transfer the data to the control CPU is also substantially shorter. The amount of calculation is also substantially smaller. If a counter is used instead of a memory to generate timing data for calibration, the amount of transfer may be kept minimal, e.g., about 320 bytes. The voltage level as well as timing are calibrated by the same counter circuit.

What is claimed is:

1. An apparatus for calibrating timing of a plurality of units of an electronic circuit tester, each of the units having a timing generating circuit for generating a timing signal, the apparatus comprising:

(a) at least one reference timing circuit for providing a reference timing signal for the units;

(b) at least one sequencer for varying a phase of the timing signal in a stepwise fashion by a predefined time step;

(c) a plurality of timing comparing circuits each located in corresponding one of the units for comparing the timing signal and the reference timing signal so as to determine a sequence of the timing signal and the reference timing signal whenever the sequencer varies the phase of the timing signals;

(d) a plurality of counter circuits each located in corresponding one of the units for counting a number of comparisons made by the timing comparing circuit until the sequence of the timing signal and the reference timing signal is reversed; and (e) a controller connected to the counter circuits for receiving data indicative of the number of comparisons from the counter circuits and calibrating timing of the units according to the data.

2. An apparatus for calibrating timing of a plurality of units of an electronic circuit tester, each of the units having a timing generating circuit for generating a timing signal, the apparatus comprising:

(a) at least one reference timing circuit for providing a reference timing signal for the units;

(b) at least one sequencer for varying a phase of the reference timing signal in a stepwise fashion by a predefined time step;

(c) a plurality of timing comparing circuits each located in corresponding one of the units for comparing the timing signal and the reference timing signal so as to determine a sequence of the timing signal and the reference timing signal whenever the sequencer varies the phase of the timing signals;

(d) a plurality of counter circuits each located in corresponding one of the units for counting a number of comparisons made by the timing comparing circuit until the sequence of the timing signal and the reference timing signal is reversed; and (e) a controller connected to the counter circuits for receiving data indicative of the number of comparisons from the counter circuits and calibrating timing of the units according to the data.

3. A method of calibrating timing of a plurality of units of an electronic circuit tester, each of the units having a timing generating circuit for generating a timing signal, the electronic circuit tester has at least one reference timing circuit providing a reference timing signal for the units, comprising the steps of:

(a) varying a phase of each of the timing signals concurrently and stepwise by a predefined time step;

(b) determining a sequence of the timing signal and the reference timing signal in each of the units whenever the phase of each of the timing signals changes;

(c) counting a number of determining of the sequence in each of the units until the sequence is reversed; and (d) calibrating timing of the plurality of units according to the counted number of the determining of the sequence.

4. A method of calibrating timing of a plurality of units of an electronic circuit tester, each of the units having a timing generating circuit for generating a timing signal, the electronic circuit tester has at least one reference timing circuit providing a reference timing signal for the units, comprising the steps of:

(a) varying a phase of the reference timing signal stepwise by a predefined time step;

(b) determining a sequence of the timing signal and the reference timing signal in each of the units whenever the phase of each of the timing signals changes;

(c) counting a number of determining of the sequence in each of the units until the sequence is reversed; and (d) calibrating timing of the plurality of units according to the counted number of the determining of the sequence.

5. An apparatus for calibrating voltage levels of a plurality of units of an electronic circuit tester, each of the units having a voltage generating circuit for generating a voltage signal, the apparatus comprising:

(a) at least one reference voltage circuit for providing a reference voltage signal for the units;

(b) at least one sequencer for varying the voltage level of the voltage signal in a stepwise fashion by a predefined voltage step;

(c) a plurality of voltage comparing circuits each located in corresponding one of the units for comparing the voltage signal and the reference voltage signal so as to determine a relationship in magnitude between the voltage signal whenever the sequencer varies the voltage of the voltage signals; and (d) a plurality of counter circuits each located in corresponding one of the units for counting a number of comparisons made by the voltage comparing circuit until the relationship in magnitude between the voltage signal and the reference voltage signal is reversed; and (e) a controller connected to the counter circuits for receiving data indicative of the number of comparisons from the counter circuits and calibrating voltage levels of the units according to the data.

6. An apparatus for calibrating voltage levels of a plurality of units of an electronic circuit tester, each of the units having a voltage generating circuit for generating a voltage signal, the apparatus comprising:

(a) at least one reference voltage circuit for providing a reference voltage signal for the units;

(b) at least one sequencer for varying the voltage level of the reference voltage signal in a stepwise fashion by a predefined voltage step;

(c) a plurality of voltage comparing circuits each located in corresponding one of the units for comparing the voltage signal and the reference voltage signal so as to determine a relationship in magnitude between the voltage signal and the reference voltage signal whenever the sequencer varies the voltage of the voltage signals; and (d) a plurality of counter circuits each located in corresponding one of the units for counting a number of comparisons made by the voltage comparing circuit until the relationship in magnitude between the voltage signal and the reference voltage signal is reversed; and (e) a controller connected to the counter circuits for receiving data indicative of the number of comparisons from the counter circuits and calibrating voltage levels of the units according to the data.

7. A method of calibrating voltage levels of a plurality of units of an electronic circuit tester, each of the units having a voltage generating circuit for generating a voltage signal, the electronic circuit tester has at least one reference voltage generating circuit providing a reference voltage signal for the units, comprising the steps of:

(a) varying a voltage level each of the voltage signals concurrently and stepwise by a predefined voltage time step;

(b) determining a relationship in magnitude between the voltage signal and the reference voltage signal in each of the units whenever the voltage of each of the voltage signals changes;

(c) counting a number of determining of the relationship in each of the units until the relationship is reversed; and (d) calibrating voltage levels of the plurality of units according to the counted number of the determining of the relationship.

8. A method of calibrating voltage levels of a plurality of units of an electronic circuit tester, each of the units having a voltage generating circuit for generating a voltage signal, the electronic circuit tester has at least one reference voltage generating circuit providing a reference voltage signal for the units, comprising the steps of:

(a) varying a voltage of the reference voltage signal stepwise by a predefined voltage step;

(b) determining a relationship in magnitude between the voltage signal and the reference voltage signal in each of the units whenever the voltage of each of the voltage signals changes;

(c) counting a number of determining of the relationship in each of the units until the relationship is reversed; and (d) calibrating voltage levels of the plurality of units according to the counted number of the determining of the relationship.

* * * * *